United States Patent
Lee

(10) Patent No.: US 7,964,495 B2
(45) Date of Patent: Jun. 21, 2011

(54) METHOD OF MANUFACTURING COMPLEMENTARY METAL OXIDE SEMICONDUCTOR IMAGE SENSOR

(75) Inventor: Han-Choon Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 924 days.

(21) Appl. No.: 11/869,498

(22) Filed: Oct. 9, 2007

(65) Prior Publication Data

US 2008/0102556 A1    May 1, 2008

(30) Foreign Application Priority Data

Nov. 1, 2006   (KR) .................. 10-2006-0107116

(51) Int. Cl.
*H01L 21/3213* (2006.01)
(52) U.S. Cl. .................. 438/624; 438/906; 510/175
(58) Field of Classification Search .................. None
See application file for complete search history.

(56) References Cited

U.S. PATENT DOCUMENTS

| | | | |
|---|---|---|---|
| 5,240,554 A * | 8/1993 | Hori et al. | 438/702 |
| 6,136,767 A * | 10/2000 | Hineman et al. | 510/176 |
| 6,660,564 B2 * | 12/2003 | Brady | 438/119 |

FOREIGN PATENT DOCUMENTS

| KR | 1020000002332 A | 1/2000 |
|---|---|---|
| KR | 1020040079614 A | 9/2004 |

* cited by examiner

*Primary Examiner* — Zandra Smith
*Assistant Examiner* — Pamela E Perkins
(74) *Attorney, Agent, or Firm* — Sherr & Vaughn, PLLC

(57) ABSTRACT

A method of manufacturing a CMOS image sensor manufacturing includes forming a plurality of metal pads over a semiconductor substrate; electrically connecting the metal pads to lower conductive film patterns of multi-layer metal wires using metal contacts; depositing an insulation film over the metal pads; patterning the insulation film to expose at least a portion of the upper surface of the metal pads; and removing impurities from an uppermost surface of the metal pads.

16 Claims, 3 Drawing Sheets

METHOD OF MANUFACTURING COMPLEMENTARY METAL OXIDE SEMICONDUCTOR IMAGE SENSOR

The present application claims priority under 35 U.S.C. 119 to Korean Patent Application No. P2006-0107116 (filed on Nov. 1, 2006), which is hereby incorporated by reference in its entirety.

BACKGROUND

An image sensor is a semiconductor device used to convert optical images detected by the image sensor to electric signals. Image sensors may be classified as a charge coupled device (CCD) and a complementary metal oxide semiconductor (CMOS).

A CCD image sensor is provided with metal oxide silicon (MOS) capacitors that are spatially positioned within close proximity to each other and charge carriers are stored in and transferred to the capacitors.

A CMOS image sensor is provided with a plurality of MOS transistors corresponding to pixels of a semiconductor device having a control circuit and a signal processing circuit as peripheral circuits. The control circuit and the signal processing unit may be integrated together to employ a switching method that detects output through the MOS transistors.

CCD and CMOS image sensors may each be provided with a plurality of color filters such as a color filter array (CFA) on the upper surface of a photodiode to receive light and generate and store photocharges. A CFA may include three color filters such as a red color filter, a green color filter and a blue color filter. The CFA may alternatively include a yellow color filter, a magenta color filter, and a cyan color filter. Moreover, the image sensor may include a photodiode for sensing light and a logic circuit for processing the sensed light into an electric signal in order to create data.

In order to increase photosensitivity, a fill factor of the ratio in which the photodiode occupies the image sensor may be increased. However, increasing the fill factor could result in the lack of space of the logic circuit, and thus, increasing the fill factor ratio may be limited within a restricted area.

Accordingly, in order to increase the photosensitivity, a light condensing technique may be implemented for changing an optical path of light entering a region other than the photodiode for condensing the light to the photodiode. For such light condensing, the image sensor may include a microlens formed on and/or over the color filters. A photoresist may be formed on the uppermost metal pad that may serve as a bonding pad, however, a chemical reaction during processing may lead to surface contamination at the uppermost metal pad. This, in turn, may result in defective semiconductor devices having inferior bondability of the wire bonding.

Figure 1:
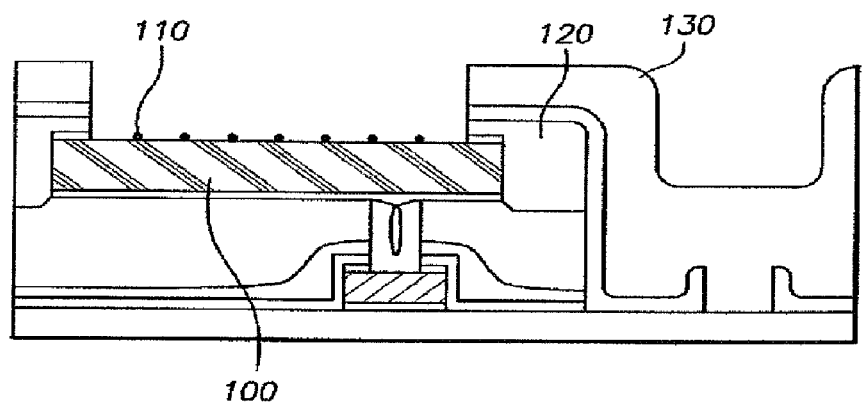

As illustrated in example FIG. 1, an uppermost metal pad 100 contaminated by a plurality of contaminants 110. When final processing for the formation of metal wiring such as the deposition of metal and patterning/etching, a protective film may be formed for protecting the semiconductor device from external shock and from permeation of natrium ions Na$^+$ and moisture. A dual layer protective film may be formed by depositing an oxide film 120 and a nitride film 130.

Etching may be carried out to expose the metal pad using a carbon-based gas or a fluoride-based gas. If a fluoride-based gas is used, any fluoride remaining after etching can react with aluminum. Accordingly, although a metal polymer can be removed by performing a solvent cleaning after the etching, the fluoride remaining on the surfaces is not thoroughly removed. In essence, as illustrated in example FIG. 2, an $Al_xF_x$ type impurity A may be generated due to the reaction between aluminum and fluoride. Impurity "A" may in turn react with oxygen or other gases and transformed into another foreign substance. Such impurities can cause inferior bondability of the wire during bonding.

SUMMARY

Embodiments relate to a method of manufacturing a complementary metal oxide semiconductor image sensor that can effectively remove byproducts that weaken bondability of the wire due to contamination of the uppermost metal pad.

Embodiments relate to a method of manufacturing a complementary metal oxide semiconductor image sensor including at least one of the following steps. Forming a plurality of metal pads over a semiconductor substrate. Electrically connecting the metal pads to lower conductive film patterns of multi-layer metal wires using contacts. Depositing an insulation film over the metal pads. Patterning the insulation film to expose at least a portion of the upper surface of the metal pads. Removing $Al_xF_x$ impurities on the surface of the metal pads and the insulation film.

DRAWINGS

Figure 2:
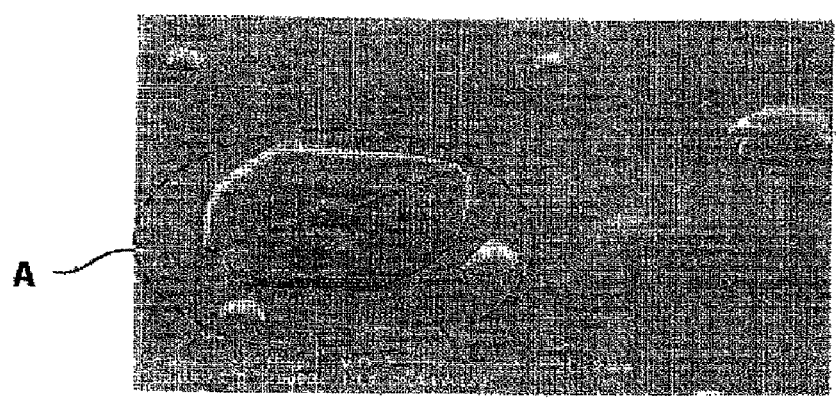

Example FIGS. 1 and 2 illustrate an uppermost metal pad contaminated by a contaminant.

Example FIGS. 3A to 3D illustrate a method of manufacturing a complementary metal oxide semiconductor image sensor, in accordance with embodiments.

DESCRIPTION

Figure 3A:
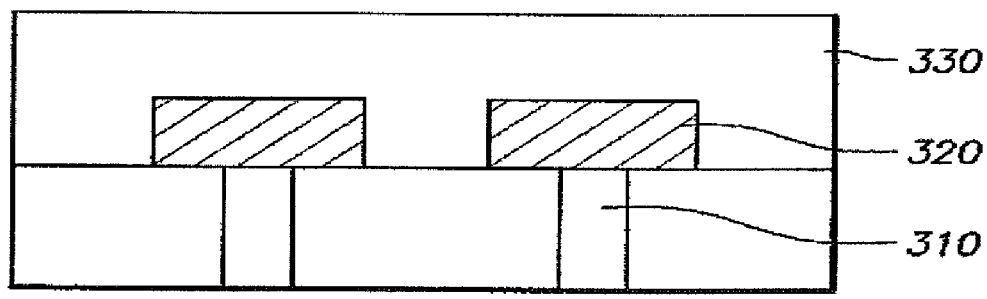

As illustrated in example FIG. 3A, a plurality of uppermost metal pads 320 can be electrically connected to lower conductive patterns such as multi-layer metal wirings through metal contacts 310. Metal contacts 310 can be composed of tungsten. Oxide film 330 which can serve as a protective film can be deposited on and/or over uppermost metal pads 320.

Metal pads 320 can be formed in a laminated structure and can be composed of at least one of Ti/Al/Ti/TiN layers, Ti/TiN/Al/Ti/TiN layers, Ti/TiN/Al/Ti—TiN layers, Ti/Al/TiN layers, and Ti/TiN/Al/TiN layers. When metal pads 320 are formed in a laminated structure of Ti/TiN/Al/Ti—TiN layers, the Ti/TiN layer can be formed using an in-situ method.

Figure 3B:
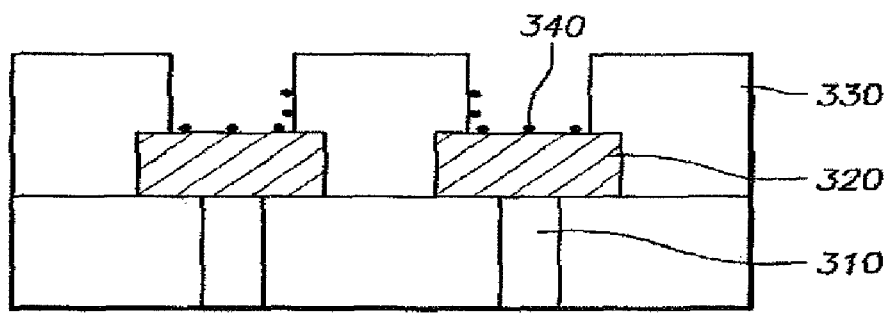

As illustrated in example FIG. 3B, a photoresist can be coated on and/or over oxide film 330 and can be patterned using exposure and etching processes to expose at least a portion of the uppermost metal pads 320 on contacts 310. Fluoride gas can be introduced into the chamber during etching. Such fluoride ions may, and may remain on metal pads 320 after the etching, and may react with aluminum to generate a plurality of $Al_xF_x$ impurities 340.

A reaction gas containing a predetermined quantity of hydrogen gas can be used to remove $Al_xF_x$ impurities 340. At least one of $H_2$ gas, $SiH_4$ gas, and $B_2H_6$ gas can be used as the reaction gas. The Gibbs free energy involved when using the respective reaction gases are listed in Table 1.

TABLE 1

| Reaction gas | Gibbs free energy ($\Delta G$) (kJ/mol) | Temperature (° C.) |
|---|---|---|
| $H_2$ | −150 kJ/mol | 400 |
| $SiH_4$ | −650 kJ/mol | 400 |
| $B_2H_6$ | −820 kJ/mol | 400 |

As illustrated in Table 1, the lowest energy is when $B_2H_6$ used as the reaction gas. Accordingly, $B_2H_6$ gas can be highly reactive with fluoride $F_x$ contained in $Al_xF_x$ impurities 340. Thereby, $B_2H_6$ gas can be he most effective gas for removing $Al_xF_x$ impurities 340.

Figure 3C:
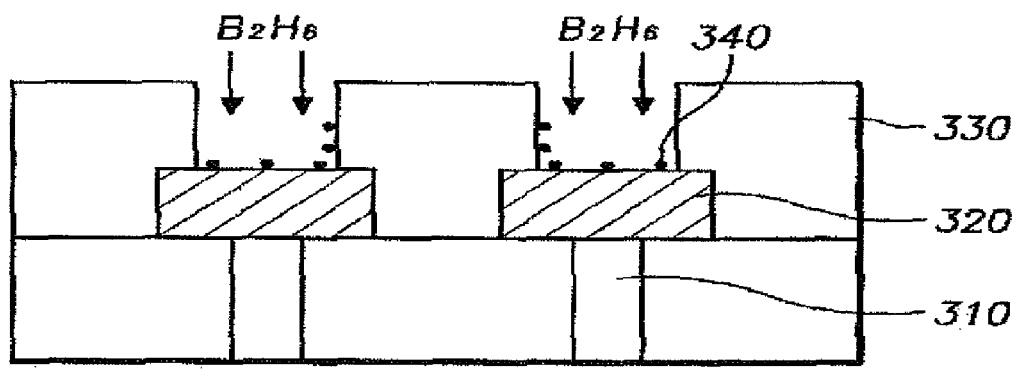
Figure 3D:
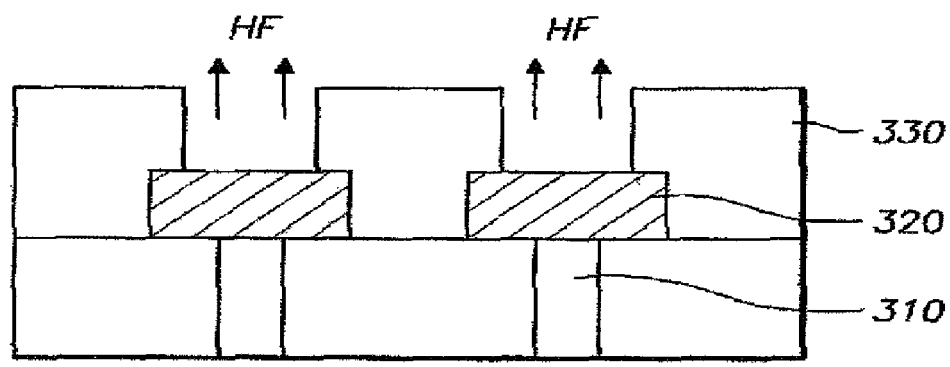

As illustrated in example FIGS. 3C and 3D, a reaction gas such as $B_2H_6$ gas can be used so that $Al_xF_x$ impurities 340 can be transformed into HF gas to be removed. The reaction temperature may be at a range of between 25 degrees centigrade to 450 degrees centigrade. Particularly, the $B_2H_6$ gas serves to react with aluminum molecules from metal pads 320 to remove the residual fluoride from etching. Because the residual fluoride serves to deteriorate the bondability due to contamination of metal pads 320, use of a reaction gas such as $B_2H_6$ can eliminate $Al_xF_x$ impurities 340.

In accordance with embodiments, $Al_xF_x$ impurities 340 which can otherwise contaminate the surface of metal pads 320, can be eliminated by injecting a reactive gas such as $B_2H_6$ after implementing an etching process.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a plurality of metal pads over a semiconductor substrate, wherein the metal pads are formed as laminate structures comprising Ti/TiN/Al/Ti—TiN layers;
    electrically connecting the metal pads to lower conductive film patterns of multi-layer metal wires using metal contacts;
    depositing an insulation film over the metal pads;
    patterning the insulation film to expose at least a portion of the upper surface of the metal pads; and
    removing impurities from an uppermost surface of the metal pads.

2. The method of claim 1, wherein the Ti—TiN portion of the Ti/TiN/Al/Ti—TiN layers is formed using an in-situ method.

3. The method of claim 1, wherein the impurities are $Al_xF_x$ impurities.

4. The method of claim 3, wherein the $Al_xF_x$ impurities are transformed into an HF gas by injecting a reaction gas.

5. The method of claim 4, wherein the reaction gas contains hydrogen.

6. The method of claim 5, wherein the reaction gas comprises $B_2H_6$.

7. The method of claim 1, wherein removing the $Al_xF_x$ impurity is carried out at a temperature range of between 25 degrees centigrade to 450 degrees centigrade.

8. A method comprising:
    forming a plurality of metal pads over a semiconductor substrate, wherein the metal pads are formed as laminate structures comprising Ti/TiN/Al/Ti—TiN layers;
    depositing an insulation film over the metal pads;
    forming a photoresist over the insulation film;
    exposing the metal pads; and
    removing impurities from the metal pads.

9. The method of claim 8, wherein the insulation film comprises an oxide film.

10. The method of claim 8, wherein removing impurities from the metal pads comprises injecting a reaction gas contains at least over the metal pads.

11. The method of claim 10, wherein removing the impurities is carried out at a temperature range of between 25 degrees centigrade to 450 degrees centigrade.

12. The method of claim 11, wherein the reaction gas contains hydrogen.

13. The method of claim 12, wherein the reaction gas comprises $B_2H_6$.

14. The method of claim 8, wherein exposing the metal pads comprises patterning the photoresist.

15. The method of claim 8, wherein the photoresist is patterned using exposure and etching processes.

16. A method comprising;
    forming a plurality of metal pads over a semiconductor substrate, wherein the metal pads are formed as laminate structures comprising Ti/TiN/Al/Ti—TiN layers;
    depositing an insulation film over the metal pads;
    forming a photoresist over the insulation film;
    patterning the insulation film to expose the metal pads by etching the photoresist, wherein the etchant includes fluorine; and
    removing $Al_xF_x$ impurities from the metal pads by injecting a reaction gas that includes $B_2H_6$.

* * * * *